United States Patent
Xu et al.

(10) Patent No.: US 10,186,288 B1
(45) Date of Patent: Jan. 22, 2019

(54) METHOD OF FABRICATING SINGLE RH LAYER OPTICAL FIELD ENHANCER WITH PRE-FOCUSING STRUCTURES

(71) Applicant: Headway Technologies, Inc., Milpitas, CA (US)

(72) Inventors: Weihao Xu, San Jose, CA (US); Cherng-Chyi Han, San Jose, CA (US); Weisheng Hu, Fremont, CA (US); Shengyuan Wang, San Jose, CA (US); Wen-Ding Huang, Fremont, CA (US); Ittetsu Kitajima, Cupertino, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/966,179

(22) Filed: Apr. 30, 2018

(51) Int. Cl.
| | |
|---|---|
| *G11B 5/127* | (2006.01) |
| *G11B 11/05* | (2006.01) |
| *G11B 5/48* | (2006.01) |
| *C23F 4/00* | (2006.01) |
| *C23C 16/50* | (2006.01) |
| *C23C 16/56* | (2006.01) |
| *C23C 16/455* | (2006.01) |

(Continued)

(52) U.S. Cl.
CPC ...... *G11B 5/4866* (2013.01); *C23C 16/45525* (2013.01); *C23C 16/50* (2013.01); *C23C 16/56* (2013.01); *C23F 4/00* (2013.01); *G11B 5/1272* (2013.01); *G11B 19/2009* (2013.01); *G11B 2005/0021* (2013.01)

(58) Field of Classification Search
CPC ... G11B 5/4866; G11B 5/6082; G11B 5/3163; G11B 11/10506; G11B 11/1051; G11B 7/1387; G11B 11/10534; G11B 2005/0021; G11B 5/127; G11B 5/6088; G11B 5/012; G02B 6/2817; G02B 6/3632; G02B 6/3825; G02B 5/6088; G02B 6/015; G02B 2006/12173; G02B 2006/12176

See application file for complete search history.

(56) References Cited

U.S. PATENT DOCUMENTS

| | | |
|---|---|---|
| 6,999,384 B2 | 2/2006 | Stancil et al. |
| 7,272,102 B2 | 9/2007 | Challener |

(Continued)

*Primary Examiner* — Nabil Z Hindi
(74) *Attorney, Agent, or Firm* — Saile Ackerman LLC; Stephen B. Ackerman

(57) ABSTRACT

A method of forming a TAMR (thermally assisted magnetic recording) write head that uses weakly plasmonic materials that are mechanically strong and thermally stable to create plasmon near field energy. The replacement of highly plasmonic materials like Au with a weakly plasmonic material like Rh avoids the thermal deformations of softer metals like Au. To maintain the performance of the head, it includes pre-focusing structures that concentrate plasmon energy as it moves towards the air bearing surface (ABS). A waveguide blocker at the distal end of the waveguide enhances the plasmons at the interface between the blocker and the dielectric material at the distal end of the waveguide. A pair of symmetrically disposed optical side shields (OSS) are formed to either side of the pole tip and a weakly plasmonic optical field enhancer of sharply defined line-width further strengthens the optical field at its point of application. The resulting structure can be effectively used in a magnetic recording apparatus such as a hard disk drive.

22 Claims, 6 Drawing Sheets

(51) Int. Cl.
*G11B 19/20* (2006.01)
*G11B 5/00* (2006.01)

(56) References Cited

U.S. PATENT DOCUMENTS

| | | |
|---|---|---|
| 8,000,178 B2 | 8/2011 | Shimazawa et al. |
| 8,295,132 B2 | 10/2012 | Jin et al. |
| 8,488,419 B1 | 7/2013 | Jin et al. |
| 8,599,656 B2 | 12/2013 | Jin et al. |
| 8,630,153 B1 | 1/2014 | Wang et al. |
| 8,691,102 B1 | 4/2014 | Araki et al. |
| 8,773,803 B2 | 7/2014 | Jin et al. |
| 8,804,468 B2 | 8/2014 | Zhao et al. |
| 8,953,421 B2 | 2/2015 | Peng et al. |
| 9,019,803 B1 | 4/2015 | Jin et al. |
| 9,025,422 B2 | 5/2015 | Aoki et al. |
| 9,042,209 B2 | 5/2015 | Balamane et al. |
| 9,053,717 B1 | 6/2015 | Matsumoto et al. |
| 9,064,515 B2 | 6/2015 | Zhao et al. |
| 9,099,112 B1 | 8/2015 | Balamane et al. |
| 9,129,620 B2 | 9/2015 | Cheng et al. |
| 9,466,320 B1 | 10/2016 | Staffaroni et al. |
| 9,685,202 B1 | 6/2017 | Duda et al. |
| 9,786,311 B2 | 10/2017 | Chen |
| 9,852,752 B1 | 12/2017 | Chou et al. |
| 9,978,409 B2 * | 5/2018 | Peng .................... G11B 5/4866 |
| 2012/0092971 A1 | 4/2012 | Schreck et al. |
| 2015/0255097 A1 | 9/2015 | Zhao et al. |
| 2017/0221505 A1 | 8/2017 | Staffaroni et al. |
| 2017/0249962 A1 | 8/2017 | Peng |
| 2018/0096702 A1 | 4/2018 | Staffaroni et al. |

* cited by examiner

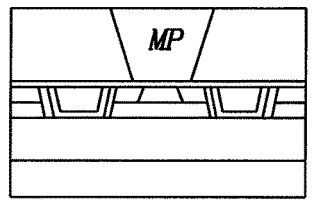
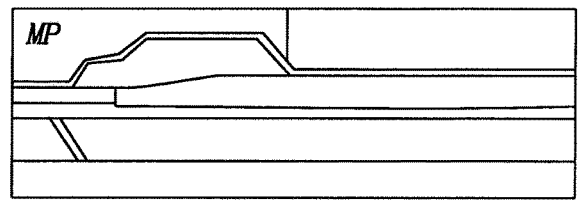
FIG. 1A    FIG. 1B
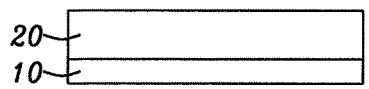
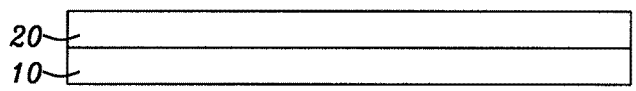
FIG. 2A    FIG. 2B
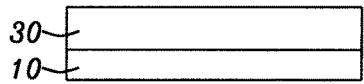
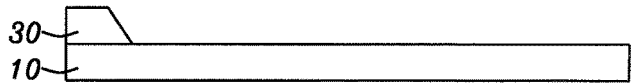
FIG. 3A    FIG. 3B
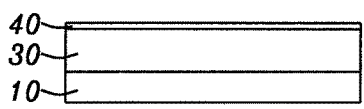
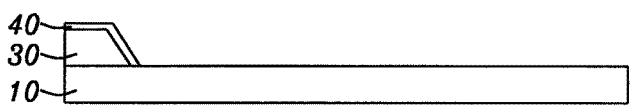
FIG. 4A    FIG. 4B
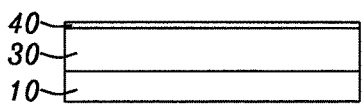
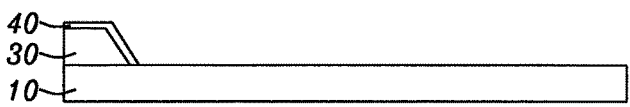
FIG. 5A    FIG. 5B

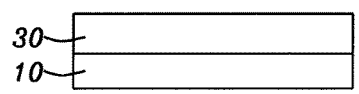
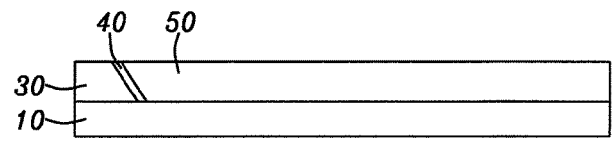
*FIG. 6A*  *FIG. 6B*
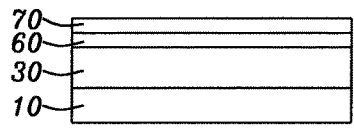
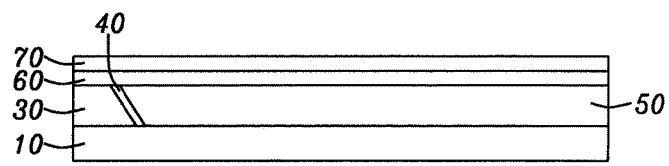
*FIG. 7A*  *FIG. 7B*
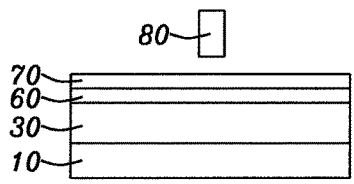
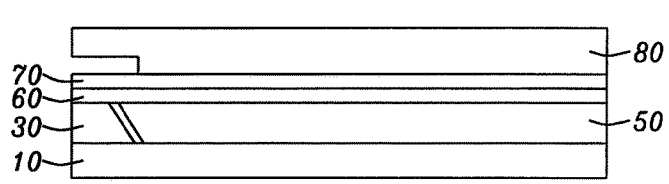
*FIG. 8A*  *FIG. 8B*
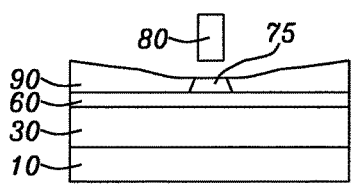
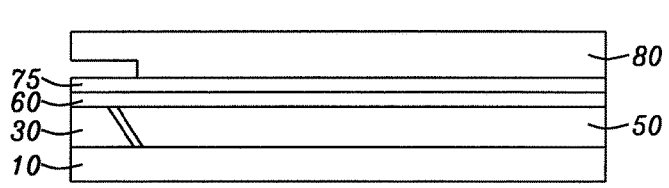
*FIG. 9A*  *FIG. 9B*

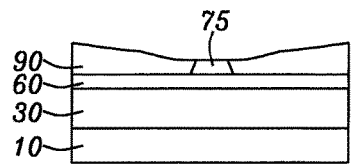
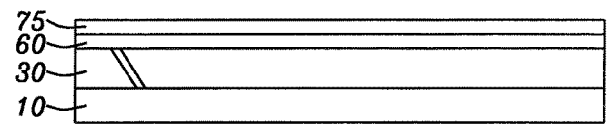
FIG. 10A  FIG. 10B
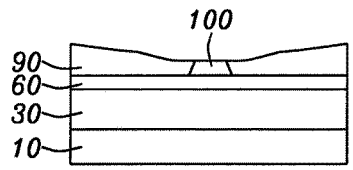
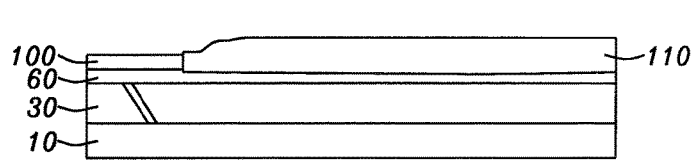
FIG. 11A  FIG. 11B
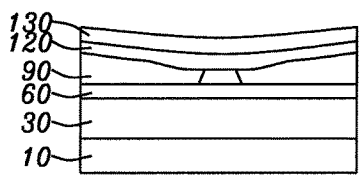
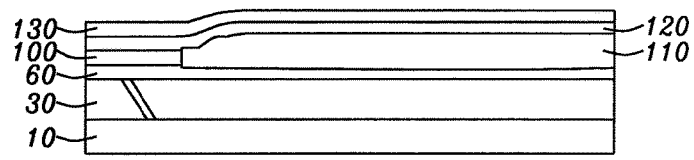
FIG. 12A  FIG. 12B
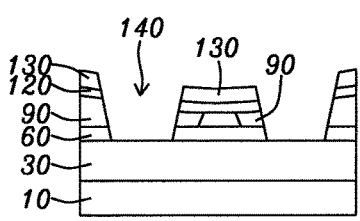
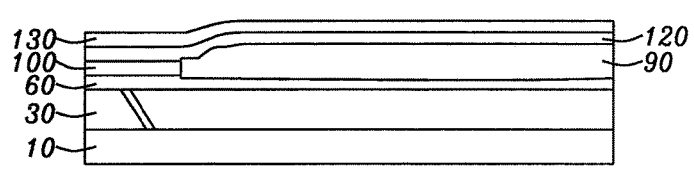
FIG. 13A  FIG. 13B

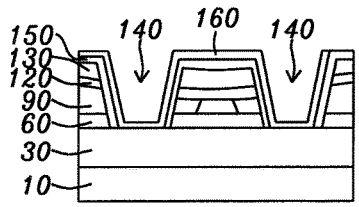
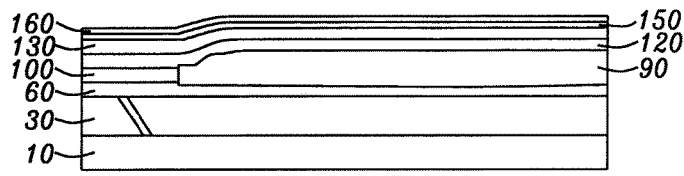
FIG. 14A  FIG. 14B
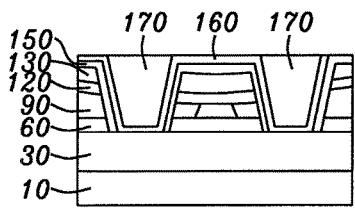
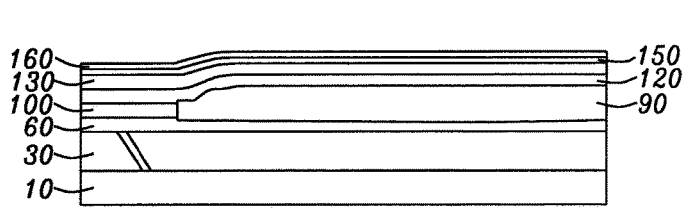
FIG. 15A  FIG. 15B
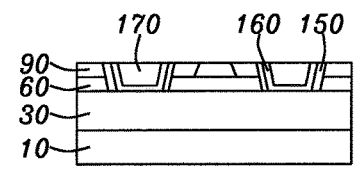
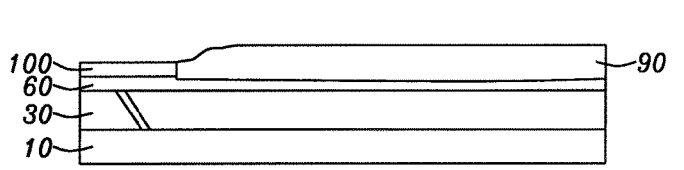
FIG. 16A  FIG. 16B
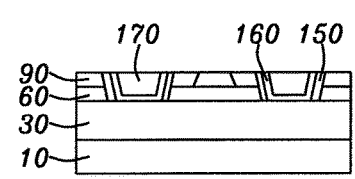
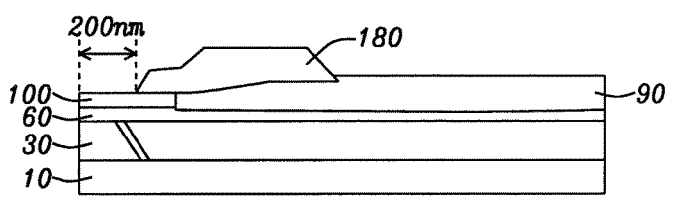
FIG. 17A  FIG. 17B
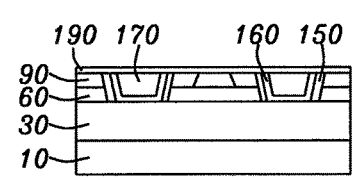
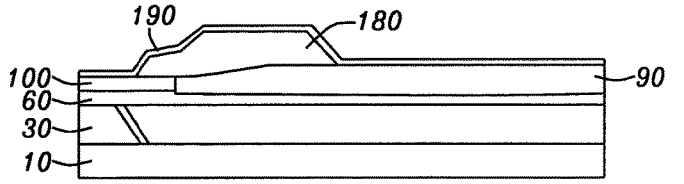
FIG. 18A  FIG. 18B

US 10,186,288 B1

METHOD OF FABRICATING SINGLE RH LAYER OPTICAL FIELD ENHANCER WITH PRE-FOCUSING STRUCTURES

This Application is related to Ser. No. 15/686,471, Filing Date Aug. 25, 2017, and to Ser. No. 15/235,171, Filing Date: Aug. 12, 2016 and to Ser. No. 15/285,721, Filing Date: Oct. 5, 2016, each assigned to a common assignee and incorporated herein by reference.

BACKGROUND

1. Technical Field

This disclosure relates to magnetic write heads that write on magnetic recording media, particularly to write heads that use Thermally Assisted Magnetic Recording (TAMR) enabled by the absorption of plasmon near-field energy from weakly-plasmonic structures.

2. Description

In general, a magnetic recording medium, on a microscopic level of composition, is a discontinuous body in which fine magnetic particles (grains) are assembled and held in place in a matrix. Each of these fine magnetic particles has a single magnetic-domain structure, so one recording bit is actually formed by a plurality of neighboring particles. In order to enhance the recording density, therefore, it is necessary to make the magnetic particles smaller in size so as to reduce irregularities at the boundaries of the bits. As the particles are made smaller, however, their volume decreases, so that the thermal stability of the magnetization may deteriorate. This causes a problem.

An index of the thermal stability in magnetization is given by $K_U V/k_B T$. Here, $K_U$ is the magnetic anisotropy energy of a magnetic fine particle, V is the volume of one magnetic fine particle, $k_B$ is the Boltzmann constant, and T is the absolute temperature. Making the magnetic fine particles smaller just reduces V, which lowers $K_U V/k_B T$ by itself, and thereby worsens the thermal stability. Though $K_U$ may be made greater at the same time as a measure against this problem, the increase in $K_U$ also increases the coercivity of the magnetic recording medium. However, the writing magnetic field intensity produced by a magnetic head is substantially determined by the saturated magnetic flux density of a soft magnetic material constituting a magnetic pole within the head. Therefore, there can be no writing if the coercivity exceeds a permissible value determined by the limit of writing magnetic field intensity.

One method proposed for solving such a problem affecting the thermal stability of magnetization is the so-called thermally assisted (or activated) magnetic recording (TAMR) scheme. In this approach, heat is applied locally to a magnetic recording medium immediately before applying a writing magnetic field, particularly while using a magnetic material having a large value of $K_U$. The heat then effectively lowers the medium's coercivity at the same position where the magnetic writing field is applied, so as to enable writing as though it were on a medium with generally lowered coercivity. This approach is expected to ultimately enable recording densities at between approximately 1 and 10 Tb/inch$^2$.

In the thermally assisted magnetic head recording apparatus, a light (optical radiation) source, such as a semiconductor laser diode, is typically suggested as the source of thermal energy. Light from such a light-emitting device is introduced into an optical waveguide configured to propagate the light. As waveguide core material, TaOx or SiON is typically used. The waveguide is surrounded with cladding material, typically Al2O3, SiON or SiO2. The combination supports a travelling mode of electromagnetic radiation. The waveguide-propagated electromagnetic radiation is transferred, by electromagnetic coupling, to a strong source of plasmons adjacent to (above or below) the waveguide located at the distal end of the waveguide. Here the waveguide excites plasmon modes. The optical radiation coupled by the waveguide to the strong plasmonic source is in turn coupled to the recording medium via plasmon near-field energy, and, thus, heats the surface of the recording media to reduce its coercivity. Since the plasmon energy is transferred to the magnetic medium from the near field of the plasmon rather than by directly focusing the optical radiation of the laser, the size of the region on the recording medium that can be effectively heated is not limited by diffraction effects of the radiation and is, therefore, much smaller than would be produced by using the optical radiation directly. It is to be noted that the strong plasmonic source typically terminates at its distal end with a small protruding "peg," whose role is to further concentrate the plasmon energy at the sharpest possibly defined spot on the recording media.

One big challenge in Thermally Assisted Magnetic Recording (TAMR) is to improve the lifetime of the recording heads while maintaining performance and low laser power requirements. Good plasmonic metals (Au, Cu, Ag) are commonly used to confine the light-generated plasmonic energy in subwavelength optical spots while providing low optical loss. The large number of free electrons in these materials, which is the reason for their good plasmonic properties, is also associated with an atomic structure that makes them soft and prone to deformation, especially at TAMR head operational temperatures.

To improve the lifetime of the TAMR recording heads it is important to remove those soft metals from areas with critical dimensions and replace them by more rigid materials. In general, these rigid materials show poorer plasmonic behavior (the ability to excite and maintain plasmon modes), which leads in many cases to higher required laser power and a resultant higher head temperature.

Prior art Rh based designs (less strongly plasmonic) show a better lifetime than the Au (strongly plasmonic) based designs, but their power requirement is higher and the embedded Au structures still show deformation. This deformation increases the power requirement even more until the heads fail.

To summarize, as demand for data storage continues to grow, the area density of a magnetic storage medium needs to correspondingly increase each year, and, thus, the magnetic head has been required to improve its performance. One of the promising technologies to deal with the increase in the area density is thermal-assisted magnetic recording (TAMR). TAMR, offers a solution to resolve this magnetic recording trilemma, which takes advantage of the fact that coercivity is temperature-dependent. A near field transducer (NFT) is used to focus laser power to a small region of the magnetic recording medium, which increases the temperature of an individual magnetic grain to a point above the Curie temperature. When this occurs, a magnetic field can be used to write data on this grain by aligning its magnetization along the applied field. One of the biggest challenges in TAMR recording is to improve the lifetime of the recording head. Currently, plasmonic metals like Au or an Au alloy are commonly used as TAMR NFT to generate a surface plasmon. However, this soft Au material is easy to deform and recede from the ABS of the head at high operating temperature. In order to overcome this issue, it is necessary to replace Au with more mechanically stable materials like Rh. The issue with Rh, however, is its relatively poor plasmonic behavior, which leads to higher required Laser power and a resulting higher head temperature.

The prior art teaches a number of approaches that recognize the need to protect the recording head from excessive heat generated, for example, by loosely coupled optical radiation from the waveguide. Examples are found in Headway application U.S. Pat. No. 15/235,171, "Plasmon Generator with metallic waveguide blocker for TAMR", Headway application U.S. Pat No. 15/686,471, "Single Rh Layer Optical Field Enhancer with Pre-Focusing Structures" and Headway application U.S. Pat. No. 15/285,721 Optical shield system for improved NFT performance". The preceding Headway dockets are fully incorporated herein by reference. Also, related, is X. Jin et al., U.S. Pat. No. 8,599,656 B2 and K. Shimazawa and K. Tanaka, U.S. Pat. No. 8,000, 178 B2, and Balamane et al., U.S. Pat. No. 9,042,209 B2. These prior art teachings are also fully incorporated herein by reference.

However, none of the above references deal with the particular problem to be addressed herein nor can their teachings be applied to that problem in the manner to be applied herein and with which to obtain the results described herein.

SUMMARY

A first object of this disclosure is to provide an optically side-shielded (OSS), waveguide-blocked (WGB) and optical field enhanced (OFE) TAMR write head that uses optically generated plasmon near-field energy provided by relatively weak plasmon sources for the thermal activation of a magnetic recording medium; yet to achieve high efficiency without using head elements that are strongly plasmonic, but soft, and would deform and recede from the ABS as a result of excessive heat being applied to them.

A second object of this disclosure is to provide such a side-shielded and waveguide-blocked TAMR head whose performance is at least comparable to that of prior art TAMR heads, yet that does not require a mechanically soft Au layer (or other soft, strongly plasmonic layer) with small patterned features, as an element of the system for focusing optical power and, therefore, such a layer being easily subject to recession and thermal deformation.

A third object of this disclosure is to provide such an optically side-shielded, optical field enhanced and waveguide-blocked TAMR head where reduced losses in the slightly less-plasmonic structures are compensated by providing an initial level of pre-focusing using larger scale dielectric and plasmonic structures.

A fourth object of this disclosure is to provide a method for pre-focusing light energy (i.e., electromagnetic radiation, such as that produced by a solid state laser) in a waveguide by coupling that light to plasmon energy as surface plasmon polaritons (SPP) in a strongly plasmonic stratified layer recessed from the ABS and direct that energy at less plasmonic elements, including a waveguide blocker and side shields formed of less plasmonic materials and smaller, less plasmonic layers that includes an optical field enhancing layer.

A fifth object of this disclosure is to achieve the previous objects while still operating within the broad bounds of current fabrication methods and practices used in related devices yet improving certain fabrication methods to enable higher resolution of the plasmon near fields. This disclosure provides a method to build a new TAMR structure, which is expected to achieve better mechanical and optical stability compared to current state of the art NFT devices since the only soft Au layer is recessed away from ABS. In this new structure, Rh is used as the final optical field enhancing structure together with Rh waveguide blocker, an optical field enhancer (OFE) and Rh optical side shields (OSS).

A sixth object of this disclosure is to slider-mount the TAMR structure, together with an associated inductively activated magnetic write-head into an operational magnetic recording apparatus, comprising such additional components as a head gimbals assembly, a flexure, a suspension, a load beam, a spindle motor and magnetic recording media.

The new proposed Rh based structures will require less power by optimizing the geometries of the associated structures, by using a tapered waveguide (WvG), an Rh waveguide blocker (WB), a narrowly defined optical field enhancer (OFE) and optical side shields (OSS), and since an Au layer that is used in the design is positioned away from the ABS, better lifetime is expected for this new structure. The new design is shown schematically in FIGS. 1A and 1B, while the process steps required for its fabrication are shown in FIGS. 2A and 2B through FIGS. 18A and 18B. Finally, FIGS. 19, 20 and 21 illustrate the mounting of the TAMR in an operational magnetic recording device, such as a hard disk drive. The figures show, schematically, the basic components of the recording device through whose use the TAMR can be applied to fulfill the presently stated objects.

BRIEF DESCRIPTION OF THE DRAWINGS

FIGS. 1(A and B) is a schematic ABS and cross-sectional view of the final form of the new design presented herein FIGS. 2(A and B) is a schematic ABS and cross-sectional view of an Rh full film layer.

FIGS. 3(A and B) is a schematic ABS and cross-sectional view of a waveguide blocker (WGB) formation.

FIGS. 4(A and B) is a schematic illustration of a full film SiO$_2$ layer deposited on top of the WGB.

FIGS. 5(A and B) shows, schematically, an ABS and cross-sectional view of a SiO$_2$ spacer RIE patterning process.

FIGS. 6(A and B) shows schematically an ABS and cross-sectional view of post TaOx CMP (chemical mechanical polishing) and WvG (waveguide) layer pattern process.

FIGS. 7(A and B) schematically shows an ABS and cross-sectional view of a full film WPG ALD (atomic layer deposition) and Rh deposition.

FIGS. 8(A and B) schematically shows an ABS and cross-sectional view of a bilayer photoresist patterning process to define the line width of the optical field enhancer (OFE).

FIGS. 9(A and B) schematically shows an ABS and cross-sectional view of an IBE patterning of the OFE and SiO$_2$ refill to obtain a flat surface.

FIGS. 10(A and B) schematically shows an ABS and cross-sectional view of the resist stripping and completion of the OFE line width definition.

FIGS. 11(A and B) schematically shows an ABS and cross-sectional view of a bilayer photo process being used to define the OFE back edge, then an IBE used to remove field Rh and refill SiO$_2$.

FIGS. 12(A and B) schematically shows an ABS and cross-sectional view of a film stack comprising an ALD and a Ru metal mask (MM) deposited on top of the OFE layer.

FIGS. 13(A and B) schematically shows an ABS and cross-sectional view of a bilayer photoresist being used to define an OSS feature and an IBE (ion-beam etch) and RIE (reactive ion etch) being used to etch the dielectric on the side of the OFE.

FIGS. 14(A and B) schematically shows an ABS and cross-sectional view of a full film Rh and Ru deposition to form the OSS (optical side shields).

FIGS. 15(A and B) schematically shows an ABS and cross-sectional view of PECVD (plasma enhanced chemical vapor deposition) of $SiO_2$ deposited and a CMP to finish a planarization.

FIGS. 16(A and B) schematically shows an ABS and cross-sectional view of the use of an IBE to remove the metal mask and a developer to remove the alumina.

FIGS. 17(A and B) schematically shows an ABS and cross-sectional view of an ABS and cross-sectional view of a bilayer photoresist being used to define the HS shape and an Au deposition deposited to recess the HS from the ABS by approximately 200 nm.

FIGS. 18(A and B) schematically shows an ABS and cross-sectional view of a full film Rh barrier deposited to separate the MP and OFE to avoid MP (main pole) damages.

DETAILED DESCRIPTION

Figure 19:
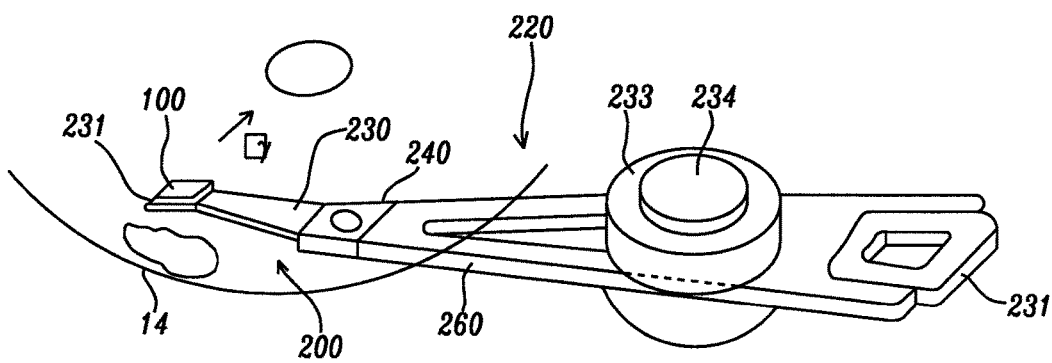
FIG. 19 schematically shows a perspective view of a head arm assembly of the present recording apparatus.
Figure 20:
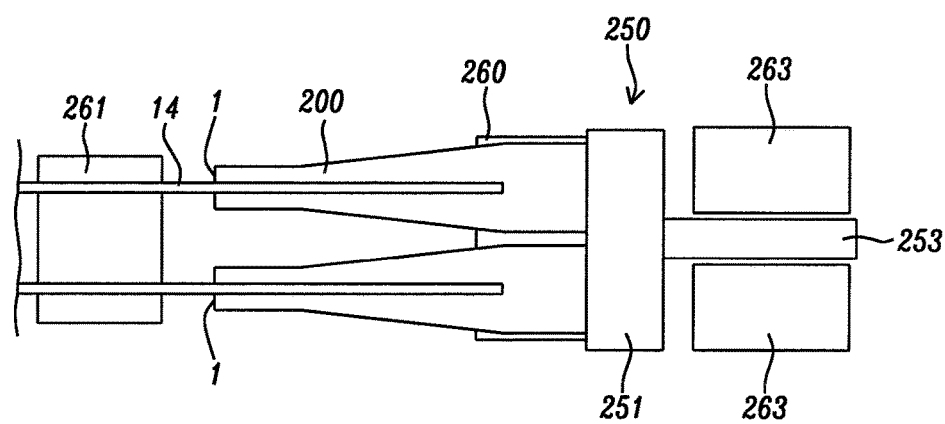
FIG. 20 schematically shows a side view of a head stack assembly of the present recording apparatus.
Figure 21:
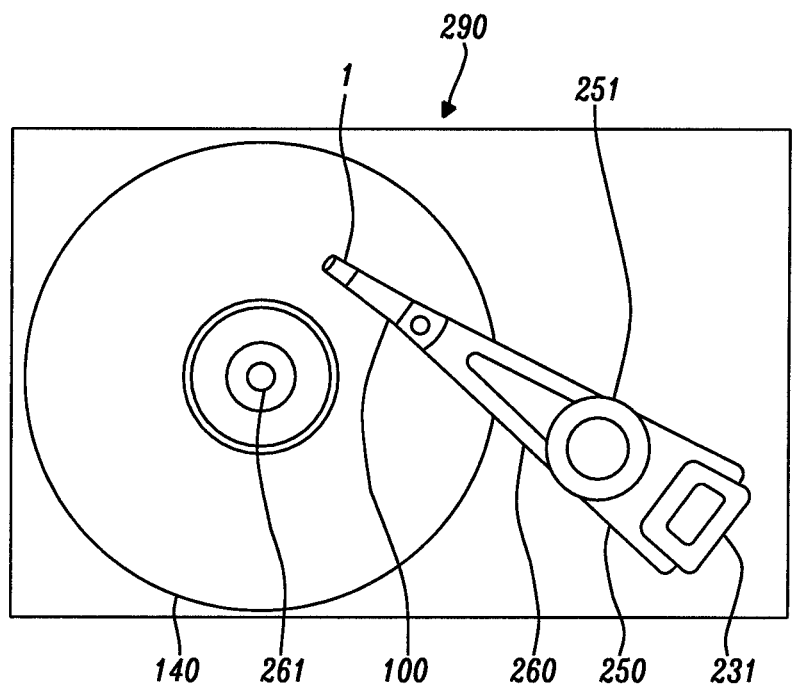
FIG. 21 schematically shows a plan view of the magnetic recording apparatus within which are mounted the components shown if FIGS. 19 and 20.

The process flow to fabricate this new design structure of FIG. 1A-1B is shown in FIGS. 2(A and B)-18(A and B). FIGS. 19-21 will show the structure of the magnetic recording apparatus in which the final structure will be used. In each figure, where applicable, the A figure will be an ABS view of the illustration and the B figure will be a lateral cross-sectional view. All figures are schematic. When referred to by figure number only, both the A and B portions are meant to apply equally.

FIGS. 1A and 1B are initial figures illustrating the completed final structure whose step-by-step fabrication is shown in the succeeding figures. Important structures shown in both 1A and 1B are the Rh optical field enhancer (Rh OFE), the recessed Au (or other strongly plasmonic) wing, the waveguide blocker (WGB) and tapered waveguide, the symmetrically disposed optical side shields (OSS) and the main pole (MP). Note, we will refer to the end of a layer closest to the ABS as its distal end and the end a rearward distance away from the ABS as its proximal end.

Referring next to FIG. 2A, there is shown the ABS view of the deposition of an Rh metal layer 20 on the upper surface of the leading shield 10. This layer has a thickness of approximately 5000 A. A layer of Ir can also be used with equal effect. In FIG. 2B, there is shown a schematic lateral cross-sectional view of the shield 10 and Rh 20 layer.

Referring next to FIG. 3A, there is shown the result of an application of a layer of photo-resist (PR) (not shown), to enable an ion-beam etch (IBE) to form a downward sloping proximal edge on the Rh metal layer 20 of the previous figure, the remaining portion of which, 30, up to the distal ABS end, will form the Waveguide blocker (WGB).

Referring next to FIGS. 4A and 5A, a layer of dielectric material, 40, here SiO2, is deposited on the angled face of the WGB layer 30 to a thickness of approximately 600 A and is aligned along the sloped face of the blocker at a distance from the ABS of approximately 500 nm. A standard photo process is applied to pattern the SiO2, shown after the patterning in FIG. 5A and reactive ion etching (RIE) is used to remove the SiO2 from the shield 10.

Referring next to FIGS. 6A and 6B there is shown the results of the deposition of a layer of TaOx on the shield layer, extending rearward from the angled face of the WGB 30. A chemical-mechanical polishing (CMP) process is applied to finish the TaOx planarization and remove any SiO2 from the top of the WGB 30. The TaOx will serve as the waveguide (WvG) core material. TaOx is patterned using standard photolithography and reactive ion etch (RIE) process and CMP. Note that the indices of refraction of the core material (e.g., TaOx) and the dielectric layer on the WGB (e.g., SiO2) must be properly chosen for the reflections at the interface to proceed properly, therefore the TaOx has a higher index of refraction than the SiO2.

FIGS. 7(A-B) to 10(A-B) show the optical field enhancer (OFE) patterning process. First, referring to FIG. 7A, a full film ALD 60 of aluminum oxide (alumina) of thickness 200A and Rh 70 of 250A thickness is deposited sequentially on top of waveguide core 50, the aluminum oxide will protect the waveguide blocker during the subsequent IBE and the plasma etch will be directed at the ABS through the alumina. Rh will be the OFE material. After that, as shown in FIGS. 8A and 8B, a bilayer photo resist (PR) layer is coated on top of Rh, and an IBE is applied to pattern the Rh, 75, followed by deposition of an SiO2 refill 90 to the get a smooth planar surface. Compared to conventional hard mask and CMP scheme, this fabrication approach provides better final OFE thickness control because of the absence of the CMP process.

FIGS. 10A and 10B show the resulting fabrication after the PR is removed.

Referring next to FIG. 11A, A photo resist is coated to pattern the OFE back edge 100, IBE followed by an SiO2 refill layer 110 are applied to define the back edge of the OFE 100 and remove the Rh from the fabrication.

FIGS. 12(A and B) to 16(A and B) show the optical side shield (OSS) fabrication process. In FIGS. 12A (and B) a film stack consisting of ALD 120 and metal mask (MM) of Ru/NiCr 130 with an opening of approximate 2 μm wide is deposited on top of the OFE layer 100. Bilayer photoresist (PR) (not shown) is coated on the MM 130 and subsequently patterned with the optical side shield feature (the line width will be ~125 nm).

Referring next to FIG. 13A, ion beam etching (IBE) is used to transfer the PR pattern into the MM 130, creating a pattern for forming openings 140. Then a RIE process, with controlled chemistry, completes the OSS openings with their desired shape by etching through the oxide layers formed on either side of the OFE (shown deposited in FIG. 9A as 90).

Referring to FIGS. 14(A and B), full films of Rh 150 and Ru 160 are sequentially deposited to form the optical side shields. The Rh 150, required for coupling purposes, is approximately 600 A in thickness. The Ru 160, required for cooling purposes, is approximately 200 A in thickness.

Referring to FIG. 15A a full film PECVD (plasma enhanced chemical vapor deposition) $SiO_2$ 170 is deposited (not seen in 15B) followed by upper surface planarization by CMP.

Referring next to FIGS. 16A and 16B an IBE is used to remove the Ru MM 130 and developer to remove the alumina (ALD) 120 to finish the OSS patterning process. The OSS's are finally separated from the OFE by between 50 and 70 nm.

Referring next to FIG. 17B, there is shown a post Au lift off profile, this Au layer 180 (or "wing") is of length approximately 1 μm and thickness approximately 1500 A and it is recessed from ABS by a distance of approximately 200 nm. The shape of the Au is defined by first depositing a photoresist pattern then depositing the Au into the pattern then stripping away the photoresist to leave the Au shaped 180 as shown.

Referring next to FIGS. 18A and 18B, there is shown the ABS and X-section view of the deposition of an Rh metal layer 190 to a thickness of approximately 200 A on the upper surface of the OFE, which is also served as diffusion barrier between the MP and OFE to avoid MP damages.

After Rh barrier deposition 190, a standard process is applied to build main pole (MP) structure and, thereby, a new structure with MP on top of Rh diffusion barrier 190 as shown in FIGS. 1A and 1B.

The proposed process flow described in relation to FIGS. 2-18, resulting in the final device shown in FIGS. 1A and 1B will provide a single layer Rh OFE structure, together with Rh WGB and OSS pre-focus structure, which will reduce the head temperature and improve the reliability of current TAMR product as was described above.

Referring finally to FIGS. 19, 20 and 21, there is shown an exemplary magnetic recording apparatus, such as a hard disk drive (HDD), through whose use the TAMR described above will meet the objects of this disclosure.

FIG. 19 shows a head gimbal assembly (HGA) 200 that includes the slider-mounted TAMR 100 and a suspension 220 that elastically supports the TAMR 100. The suspension 220 has a spring-like load beam 230 made with a thin, corrosion-free elastic material like stainless steel. A flexure 231 is provided at a distal end of the load beam and a base-plate 240 is provided at the proximal end. The TAMR 100 is attached to the load beam 230 at the flexure 231 which provides the TAMR with the proper amount of freedom of motion. A gimbal part for maintaining the TAMR at a proper level is provided in a portion of the flexure 231 to which the TAMR 100 is mounted.

A member to which the HGA 200 is mounted to arm 260 is referred to as head arm assembly 220. The arm 260 moves the TAMR 100 in the cross-track direction y across the medium 14 (here, a hard disk). One end of the arm 260 is mounted to the base plate 240. A coil 231 to be a part of a voice coil motor is mounted to the other end of the arm 260. A bearing part 233 is provided to the intermediate portion of the arm 260. The arm 260 is rotatably supported by a shaft 234 mounted to the bearing part 233. The arm 260 and the voice coil motor that drives the arm 260 configure an actuator.

Referring next to FIG. 20 and FIG. 21, there is shown a head stack assembly and a magnetic recording apparatus in which the TAMR 100 is contained. The head stack assembly is an element to which the HGA 200 is mounted to arms of a carriage having a plurality of arms. FIG. 20 is a side view of this assembly and FIG. 21 is a plan view of the entire magnetic recording apparatus.

A head stack assembly 250 has a carriage 251 having a plurality of arms 260. The HGA 200 is mounted to each arm 260 at intervals to be aligned in the vertical direction. A coil 231 (see FIG. 19), which is to be a portion of a voice coil motor is mounted at the opposite portion of the arm 260 in the carriage 251. The voice coil motor has a permanent magnet 263 arranged at an opposite location across the coil 231.

Referring finally to FIG. 21, the head stack assembly 250 is shown incorporated into a magnetic recording apparatus 290. The magnetic recording apparatus 290 has a plurality of magnetic recording media 14 mounted on a spindle motor 261. Each individual recording media 14 has two TAMR elements 100 arranged opposite to each other across the magnetic recording media 14 (shown clearly in FIG. 20). The head stack assembly 250 and the actuator (except for the TAMR itself) act as a positioning device and support the TAMR heads 100. They also position the TAMR heads correctly opposite the media surface in response to electronic signals. The TAMR records information onto the surface of the magnetic media by means of the magnetic pole contained therein.

Revisions and modifications may be made to methods, materials, structures and dimensions employed in forming and providing a TAMR magnetic write head having weakly plasmonic materials that are structurally and thermally stable, located at the ABS, to which pre-focusing is applied to maintain efficiency and whereby plasmon modes are converted to narrowly confined surface plasmons excited by a tapered waveguide abutted by a waveguide blocker and symmetrically flanked by optical side shields and pre-focused onto an optical field enhancer, while still forming and providing such a device and its method of formation in accord with the spirit and scope of the present disclosure as defined by the appended claims.

What is claimed is:
1. A TAMR head, comprising:
 a pre-focusing device with large scale dielectric and plasmonic metal structures, together with an optical field enhancing (OFE) structure of well-defined line width, to direct optical energy at an air-bearing surface (ABS); wherein said pre-focusing device comprises:
 a waveguide blocker abutting said sloped distal end and separated from said sloped distal end by a dielectric layer, wherein said waveguide blocker extends from said sloped distal end to said ABS;
 a tapered waveguide core having a sloped distal end for transmitting a focused electromagnetic radiation towards said ABS;
 a highly plasmonic layer adjacent to said tapered waveguide core wherein a distal end of said highly plasmonic layer is positioned a distance from said ABS and configured to couple electromagnetically with said waveguide core along an interface at its region of adjacency with said waveguide core whereby said electromagnetic coupling generates plasmons in said highly plasmonic layer and said interface;
 a weakly plasmonic optical field enhancing (OFE) layer of narrow linewidth and mechanical stability that enhances the existing optical fields from said pre-focusing device whereby near-field plasmon energy is produced at said ABS;
 a pair of optical side shields symmetrically disposed to either side of said weakly plasmonic field enhancing layer for eliminating poorly focused radiation from emerging at said ABS.

2. The TAMR write head of claim 1 wherein said optical side shields are formed of layers of any of the weakly plasmonic materials Rh, Ir, Pt, Pd or their composites.

3. The TAMR write head of claim 1 wherein said waveguide is tapered to a narrower width in an x-y plane, wherein said narrowing occurs in a direction towards said ABS.

4. The TAMR write head of claim 1 wherein said dielectric layer between said WGB and said waveguide core is formed of a dielectric material having a smaller refractive index than that of said core.

5. The TAMR write head of claim 1 wherein said waveguide core material is TaOx.

6. The TAMR write head of claim 3 wherein a gap between an inner edge of an OSS and an outer edge of said OFE is between approximately 40-60 nm.

7. The TAMR of claim 1 further comprising:
A main magnetic pole having a distal end emerging at said ABS positioned in the vicinity of said OFE and configured to emit a magnetic flux to a magnetic recording medium within a region activated by said plasmonic near-field energy.

8. A head gimbal assembly, comprising
the TAMR of claim 7, wherein said TAMR is mounted in a slider;
a suspension that elastically supports said slider-mounted TAMR, wherein
said suspension has a flexure to which said slider-mounted TAMR is joined, a load beam with one end connected to said flexure and a base plate connected to the other end of said load beam.

9. A magnetic recording apparatus, comprising:
the slider-mounted TAMR of claim 8;
a magnetic recording medium positioned opposite to said slider;
a spindle motor that rotates and drives said magnetic recording medium;
a device that supports the slider and that positions said slider relative to said magnetic recording medium.

10. A method for forming a TAMR head, comprising:
forming a pre-focusing device for directing focused optical energy at an ABS of said TAMR head and an optical field enhancing (OFE) structure to enhance already existing optical fields, wherein said optical field enhancing structure emerges at said ABS of said TAMR head; wherein said formation comprises:
forming a waveguide blocker having a planar distal end emerging at said ABS and a downward sloping end at a proximal end;
forming a tapered waveguide core having a sloped distal end abutting said slope;
forming a weakly plasmonic optical field enhancing layer between said highly plasmonic layer and said waveguide core, said weakly plasmonic field enhancing layer extending to said ABS, whereat pre-focused optical radiation is directed;
forming a pair of optical side shields symmetrically disposed to either side of said weakly plasmonic field enhancing layer;
forming a highly plasmonic layer adjacent to said tapered waveguide core wherein a distal end of said highly plasmonic layer is positioned a distance from said ABS and configured to couple electromagnetically with said waveguide core along its region of adjacency with said waveguide core thereby completing said pre-focusing structure; then
forming a barrier layer over said completed pre-focusing structure.

11. The method of claim 10 wherein said waveguide blocker and waveguide formations comprise the following sequence of steps:
providing a bottom shield layer which will form a substrate on which said TAMR head will be formed, a distal end of said bottom shield layer forming part of an ABS of said TAMR head;
depositing a metallic layer on said bottom shield layer that will be patterned to form a waveguide blocker (WGB), the distal end of said layer also forming part of said ABS;
using an ion-beam etch (IBE), patterning a distal portion of said metallic layer by forming a proximal downward sloping end of said metallic layer at a distance away from said distal end and removing the remainder of said metallic layer extending along said shield layer rearward from said downward sloping end;
depositing a first dielectric layer over said upper portion and downward sloping proximal end of said patterned distal blocker region;
depositing a layer of dielectric waveguide core material over said exposed shield layer, said core material abutting said dielectric layer on said downward sloping blocker region;
patterning said waveguide core material to form a tapered core using standard photolithographic patterning, followed by a reactive ion etch (RIE) and chemical mechanical polishing (CMP) for planarization and removal of remaining dielectric on the upper surface of the WgB.

12. The method of claim 11 wherein said weakly plasmonic single layer OFE is formed by a method comprising:
depositing, sequentially, an ALD layer and a layer of weakly plasmonic, mechanically stable material on top of said waveguide core;
forming, on top of said sequence of layers a bi-layer of photoresistive material;
using said bi-layer, said layer of weakly plasmonic mechanically stable material is patterned to define a back (proximal) edge and thereby form an OFE layer of sharply defined narrow line width; then
using an IBE process, remove remaining weakly plasmonic material and depositing a dielectric refill layer behind the proximal edge of said OFE layer.

13. The method of claim 12 wherein said pair of symmetrically positioned optical side shields is formed by a method comprising:
depositing, sequentially, an ALD layer and a metal mask (MM) layer on top of said OFE layer and said dielectric refill layer previously deposited behind said OFE layer;
coating said MM layer with a bi-layer of photoresistive material and patterning said bi-layer of photoresistive material to delineate said OSS features; then
using an RIE process in conjunction with said MM, etching through dielectric layers to either side of said OFE layer to create in each side an opening within which to deposit shield material;
depositing, sequentially, in each opening two shielding layers comprising a weakly plasmonic material and a metallic material over said weakly plasmonic material, covering exposed sides of each said opening; then
using a plasma enhanced chemical vapor deposition (PECVD) process, depositing a dielectric material over said two deposited layers, said dielectric material completely filling each said opening; then
applying an IBE to remove said MM layer and a developer to remove said ALD layer.

14. The method of claim 13 wherein said highly plasmonic layer is formed by a method comprising:
coating the top of said OFE layer with a layer of patterned photoresistive material to define a shape of said highly plasmonic material; then
using said patterned photoresistive material, depositing a layer of highly plasmonic material shaped so that a distal end of said highly plasmonic material layer terminates on top of said OFE layer at a recessed distance from said ABS thereby completing said pre-focusing structure; then depositing a layer of weakly plasmonic material over said pre-focusing structure to serve as a protective barrier between said pre-focusing structure and a main pole to be formed on said structure.

15. The method of claim 14 further comprising:

forming a main pole over said pre-focusing structure, wherein said main pole emerges at said ABS in the vicinity of said OFE and is configured to emit a magnetic flux to a magnetic recording medium within a region activated by said plasmonic near-field energy.

16. The method of claim 15 wherein said distal end of said layer of highly plasmonic material terminates approximately 200 nm from said ABS.

17. The method of claim 14 wherein said highly plasmonic layer is a layer of Au approximately 1500 A in thickness.

18. The method of claim 14 wherein said highly plasmonic layer is recessed from said ABS by approximately 200 nm.

19. The TAMR of claim 1 wherein said highly plasmonic layer is a layer of Au approximately 1500 A in thickness.

20. The TAMR of claim 1 wherein said highly plasmonic layer is recessed from said ABS by approximately 200 nm.

21. The TAMR of claim 1 wherein said OFE is formed of Rh deposited to a thickness of approximately 250 A.

22. The method of claim 12 wherein said OFE is formed of Rh deposited to a thickness of approximately 250 A.

* * * * *